US009999147B1

(12) United States Patent
Quick et al.

(10) Patent No.: US 9,999,147 B1
(45) Date of Patent: Jun. 12, 2018

(54) DUMMY LINE REPLACEABLE UNIT

(71) Applicant: Airbus Americas Engineering, Inc., Mobile, AL (US)

(72) Inventors: Scott Quick, Mobile, AL (US); Wesley Duggar, Mobile, AL (US)

(73) Assignee: Airbus Americas Engineering, Inc., Mobile, AL (US)

( * ) Notice: Subject to any disclaimer, the term of this patent is extended or adjusted under 35 U.S.C. 154(b) by 0 days. days.

(21) Appl. No.: 15/420,986

(22) Filed: Jan. 31, 2017

(51) Int. Cl.
*H05K 7/18* (2006.01)
*H05K 5/02* (2006.01)
*H05K 7/14* (2006.01)
*H05K 7/20* (2006.01)

(52) U.S. Cl.
CPC ......... *H05K 5/0286* (2013.01); *H05K 7/1401* (2013.01); *H05K 7/18* (2013.01); *H05K 7/20845* (2013.01)

(58) Field of Classification Search
CPC .. H05K 7/18; H05K 7/1401; H05K 7/208475; H05K 7/20536; H05K 7/20709; H05K 5/0286; H05K 7/1485; H05K 7/1461; H05K 7/1421; H02G 3/08
USPC ............... 361/716, 715, 690, 807, 724, 714; 312/265.1, 265.5; 174/50
See application file for complete search history.

(56) References Cited

U.S. PATENT DOCUMENTS

| 5,129,594 A * | 7/1992 | Pease ................... H05K 7/1412 174/541 |
| 6,900,387 B2 * | 5/2005 | Gravell .............. H05K 7/20727 174/17 VA |
| 7,473,931 B1 | 1/2009 | Beseth et al. |
| 7,645,188 B1 | 1/2010 | Peerbolt |
| 8,035,985 B2 | 10/2011 | Nemoz et al. |
| 8,348,138 B2 | 1/2013 | Dautenhahn |
| 8,369,069 B2 | 2/2013 | Osternack et al. |
| 8,870,149 B2 | 10/2014 | Rodig |
| 9,359,083 B2 | 6/2016 | Olive |
| 9,371,142 B2 | 6/2016 | Rodig |

OTHER PUBLICATIONS

Drawings of a Typical Equipment Rack for a Commercial Passenger Aircraft (pre-2017), one page.

* cited by examiner

*Primary Examiner* — Dion R Ferguson
*Assistant Examiner* — Mandeep S Buttar
(74) *Attorney, Agent, or Firm* — Nixon & Vanderhye P.C.

(57) ABSTRACT

A Dummy LRU installed on a LRU tray in an equipment tray, the Dummy LRU including a base plate with ventilation openings and a wedge biased against the LRU tray or a connector associated with the LRU tray by hold-down fasteners of the LRU tray, a support member, and may include a seal element disposed on the support member to seal a electrical connector adjacent the LRU tray.

22 Claims, 7 Drawing Sheets

DUMMY LINE REPLACEABLE UNIT

BACKGROUND OF THE INVENTION

The present invention relates to the field of aeronautical equipment racks and Line Replaceable Unit trays that retain Line Replaceable Units (LRUs), and specifically to techniques for addressing problems associated with empty Line Replaceable Unit trays.

Aircraft and other vehicles and systems commonly include Line Replaceable Units disposed on LRU trays in equipment racks within their fuselage. LRUs often include electronic equipment, computers, radio, avionics, flight systems, entertainment systems and other auxiliary electronic equipment.

LRU trays support the LRUs in the equipment rack and provide connectors between the LRUs and the electrical systems in the aircraft. A LRU tray may include a bracket to support the LRU, hold-down fastening elements to secure LRUs to the LRU trays, connectors to connect with the LRUs, and airflow openings to allow airflow through the LRU tray to the LRU.

LRU trays and the equipment racks that house the trays enable LRUs to be easily removed and replaced. To remove and replace an LRU, the hold-down fastening elements are released and the LRU is removed from the LRU tray which disconnects the connectors on the LRU from the electrical system for the aircraft. A replacement LRU is slid onto the LRU tray such that the connectors on the back of the LRU engage the connectors on the back of the tray, and the hold-down fastening elements are tightened to secure the LRU to the tray.

Some LRU trays in an equipment rack may be empty. There is typically no requirement of an equipment rack that all LRU trays be filled and there are advantages to having empty trays that can be filled if a need arises for another LRU.

If a LRU tray is left empty, the electrical connectors at the back of the empty LRU tray may be covered. The connectors may be covered with caps or other devices that shield the connectors. The caps or other covering devices may not be secured to the connectors and thus may not properly seal the connectors from water and debris.

An empty LRU tray may have unsecured hold-down fastening elements. These fastening elements typically are threaded and turn to engage the LRU. If there is no LRU in a tray, the hold-down fastening elements are not secured and thus prone to vibrate during operation of the aircraft. Vibration can create unwanted noise and wear the fastening elements.

Air flows through the equipment racks to provide cooling air for the electronic components of the LRUs. The airflow through the equipment rack and the LRUs is affected by empty trays. An empty tray may offer less resistance to air flow than a tray supporting an LRU.

BRIEF SUMMARY OF INVENTION

The inventors conceived of a Dummy LRU that simultaneously seals electrical connectors, controls airflow, and secures hold-downs of empty LRU trays. The inventors realized that use of a component with airflow openings on a base plate would control airflow through an empty LRU tray, mimicking an installed LRU and thus ensuring sufficient cooling to the LRUs in the equipment rack. The inventors realized that providing a seal on a support member of the Dummy LRU would seal electrical connectors of the LRU tray, thus preventing intrusion of debris. The inventors realized that providing fastening elements on a base plate of a component of the Dummy LRU would allow a user to secure the hold-downs of the LRU tray.

The invention may be embodied as a Dummy Line Replaceable Unit (LRU) configured to mount on a line replaceable unit tray, the Dummy LRU comprising: a base plate; a wedge element attached to a first edge of the base plate, wherein the wedge element is configured to be biased against the line replaceable unit tray or electrical connector adjacent the tray; a support member connected to the first edge region of the base plate or to the wedge element; a seal element disposed on the support member, wherein the seal element is configured to seal an electrical connector aligned with the LRU tray, and a fastening element at a second edge, opposite to the first edge, of the base plate, wherein the fastening element is configured to engage a hold-down fastener of the LRU tray.

The invention may be embodied as a Dummy line replaceable unit (LRU) configured to mount on a line replaceable unit tray in an equipment rack, the Dummy LRU comprising: a base plate having an uncovered upper surface and a lower surface configured to face a supporting plate of the line replaceable unit tray, wherein the uncovered upper surface is configured to face an open interior region of the equipment rack; a support member oriented orthogonally to the base plate; a wedge element configured to be biased against the line replaceable unit tray or a structure of the equipment rack aligned with the line replaceable unit tray, wherein a first edge of the base plate is connected to at least one of the support member and the wedge element, and a fastening element at a second edge, opposite to the first edge, of the base plate, wherein the fastening element is configured to engage a hold-down fastener of the line replaceable unit tray.

The invention may be embodied as a Dummy Line Replaceable Unit (LRU) configured to mount on a Line Replaceable Unit Tray in an equipment rack, the Dummy LRU comprising: a base plate having an uncovered upper surface and a lower surface configured to face a supporting plate of the line replaceable unit tray, wherein the uncovered upper surface is configured to face an open interior region of the equipment rack; a plurality of ventilation openings in the base plate configured to align or otherwise interact with ventilation openings in the supporting plate of the line replaceable unit tray or electrical connector associated with the LRU tray; a wedge element attached to a first edge of the base plate, wherein the wedge element is configured to be biased against the line replaceable unit tray, and a fastening element at a second edge, opposite to the first edge, of the base plate, wherein the fastening element is configured to engage a hold-down fastener of the LRU tray.

The invention may be embodied as an assembly of a line replaceable unit (LRU) tray and a Dummy line replaceable unit (DLRU) comprising:

(a) an LRU tray including: a horizontal supporting plate; a vertical back plate at a rear of the supporting plate and orthogonal to the supporting plate, wherein the vertical back plate includes an opening through which extends an electrical connector, and a hold-down fastener at a front of the supporting plate, and (b) a Dummy LRU configured to be installed on the LRU tray, the Dummy LRU including: a base plate, wherein the base plate includes ventilation openings aligned or otherwise interact with ventilation openings in the supporting plate of the LRU tray; a support member connected to a first edge region of the base plate; a seal element disposed on the support member, wherein the seal element is configured to seal the electrical connector, and a fastener element at a second edge, opposite to the first edge, of the base plate, wherein the fastener element is configured to engage the hold-down fastener of the LRU tray.

The invention may be embodied as a method of installing a Dummy line replaceable unit (DLRU) on an equipment rack, the method comprising: placing a line replaceable unit (LRU) tray on the equipment rack; overlaying a base plate of the Dummy LRU over a support plate of the LRU tray; sealing an electrical connector adjacent the LRU tray with a seal element on the support member of the Dummy LRU; wedging a wedge element of the base plate of the Dummy LRU against the LRU tray or the electrical connector; aligning a fastener element of the base plate with a hold-down fastener of the LRU tray, wherein the fastener element is at an edge of the base plate opposite to the wedge element; engaging the hold-down fastener of the LRU tray with the fastener element of the base plate, such that the hold-down fastener applies a bias force to the base plate, and biasing the wedge element against the LRU tray by the bias force.

The invention may be embodied as a method of installing line replaceable units (LRUs) on an equipment rack, the method comprising: for each line replaceable unit (LRU) trays in the equipment rack, determining if the LRU tray is supporting a LRU or whether the LRU tray is open, and for each of the open LRU trays, installing a Dummy LRU on the LRU tray, wherein all of the LRU trays in the equipment rack have one of the Dummy LRUs or the LRUs.

The uniformity of the shape and connections of LRUs, the Dummy LRUs and the LRU trays allows for uniformity in the procedures for the installation and removal of LRUs from the equipment racks. Aircraft may be serviced by technicians and mechanics at aircraft maintenance facilities all over the world. The uniformity of LRUs, Dummy LRUs and their installation procedures are especially helpful in training the many technicians and mechanics, given the different languages that they speak.

Advantages of the Dummy LRU disclosed herein include that it is uniform, easy to install and remove, and that technicians and mechanics will find in the Dummy LRUs a single component that provides a protective seal for electrical connectors at the back of a LRU tray, an air resistance device that mimics an actual LRU and a device that secures all hold-down fastening elements on a LRU Tray.

A procedure may be set for the mechanics and technicians to follow that requires all LRU trays in an equipment rack to be either filled with an LRU or a Dummy LRU. This procedure ensures that all electrical connectors at the back of the LRU trays in an equipment rack are covered, that all LRU hold-down fastening elements in the rack are secured and that the airflow through the equipment rack is uniform.

BRIEF DESCRIPTION OF THE DRAWINGS

The Figures describe below illustrate an embodiment of the invention and its use.

DETAILED DESCRIPTION OF THE INVENTION

Figure 1:
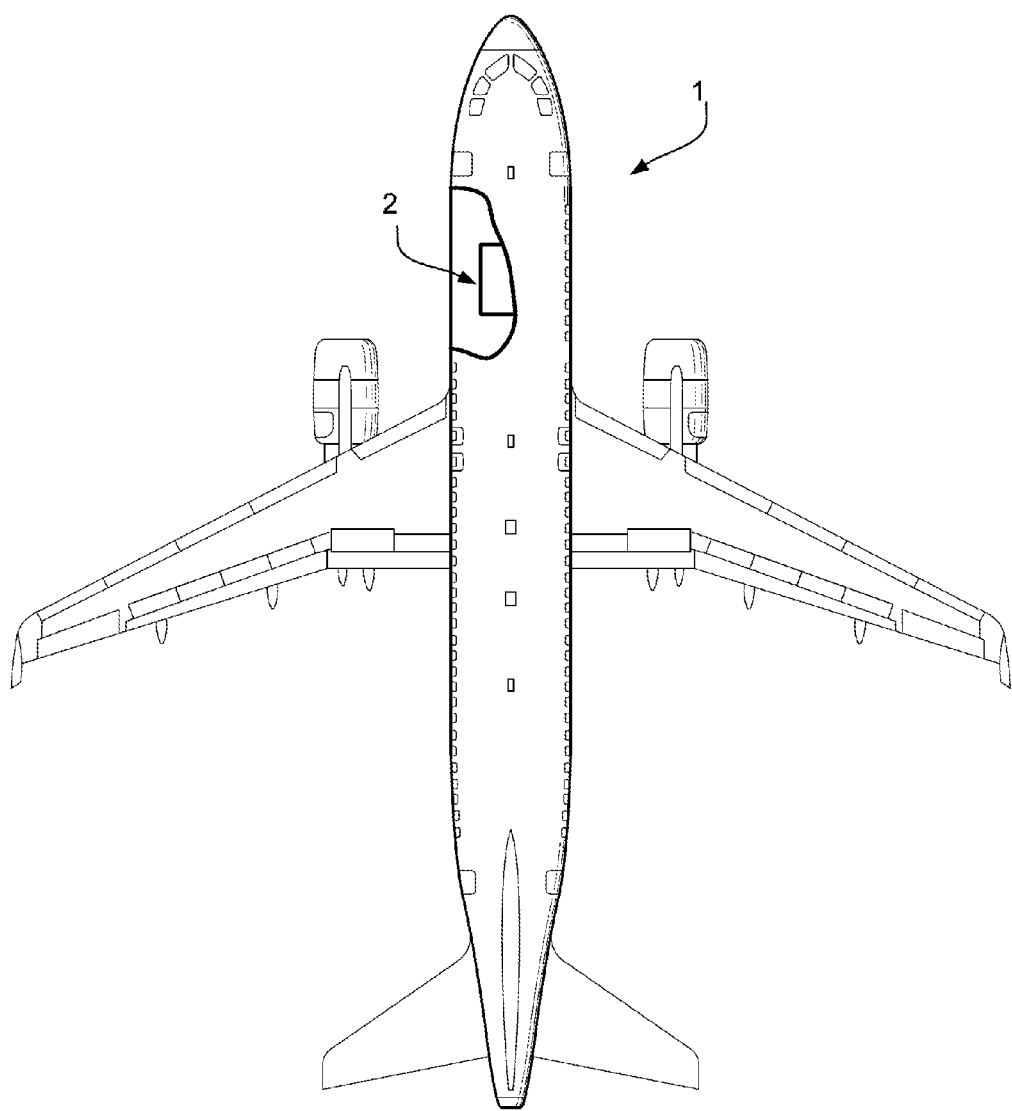
FIG. 1 is top view of an airplane.

FIG. 1 shows a top view of an aircraft 1 with a portion of the fuselage removed to expose an equipment rack 2 mounted within the fuselage. The equipment rack 2 houses electronic components configured as Line Replaceable Units (LRUs). The LRUs provide various computing and electronic functions for the aircraft, including avionics, flight management data computers and in-flight entertainment systems. LRUs are typically configured as specific electronic systems, such as flight management systems, avionics, flight entertainment systems and other computer and electronic systems used to operate an aircraft.

LRUs may have a standard housing for electronic equipment and uniform electrical connections for the equipment at the rear of the LRU. LRUs are easily and quickly removed and installed in equipment rack 2. The LRUs are each installed on and supported by a respective LRU tray 3.

LRUs tend to have a uniform external shape and connections on a rear surface. The equipment rack 2 is a lightweight shelving system containing baffles for LRU ventilation, mechanical supports and wiring connections for the LRUs, computers, or other electronic equipment housed in the equipment rack 2.

Figure 2:
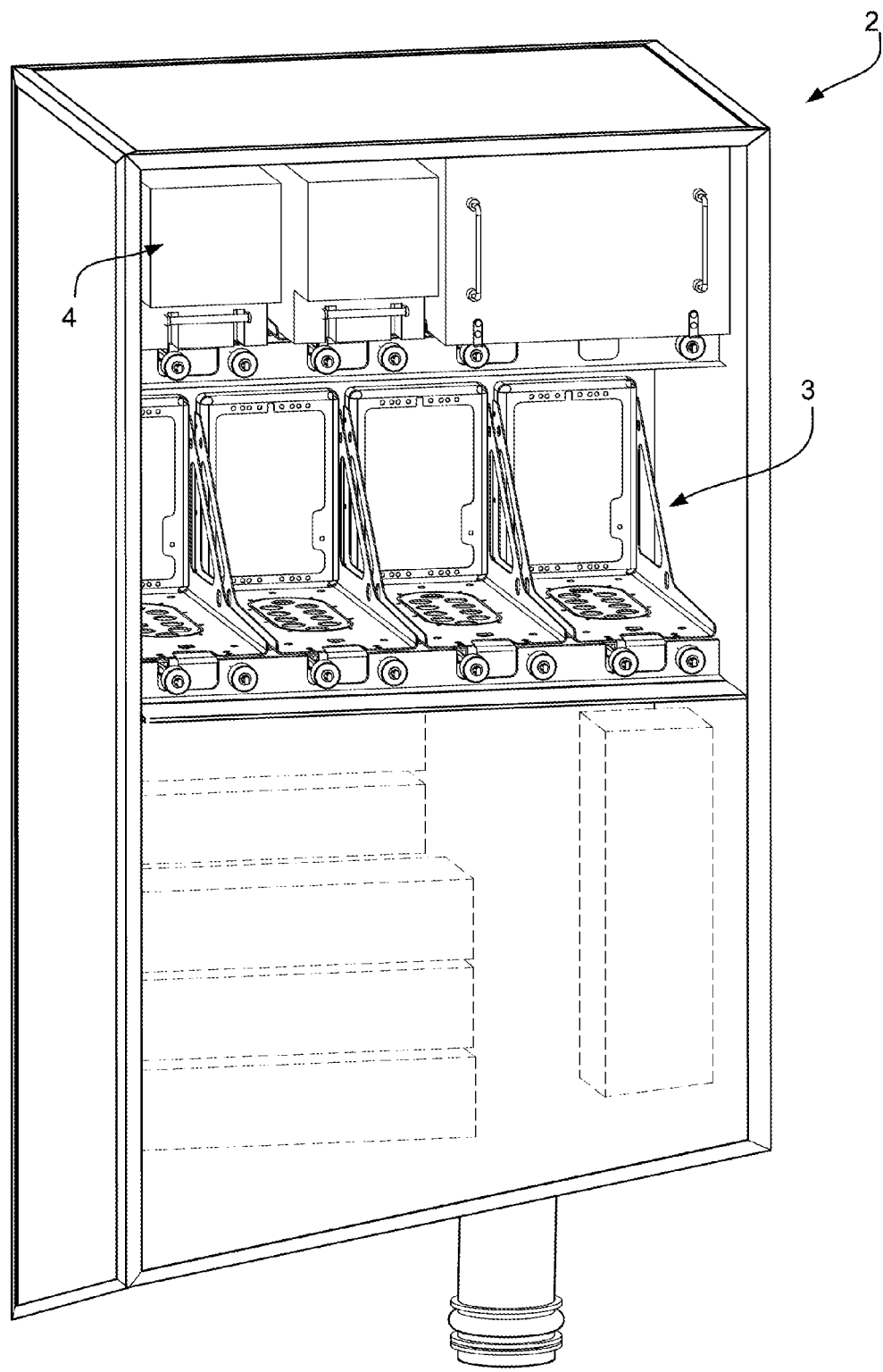
FIG. 2 is a view of an equipment rack.

FIG. 2 shows a front view of equipment rack 2 which houses LRUs 4. The equipment rack 2 includes a number of LRU trays 3 which support LRUs 4 for insertion into equipment rack 2. FIG. 2 also discloses a number of empty LRU trays 3 with LRUs removed therefrom.

LRU trays 3 provide structural support for LRUs 4. LRU trays 3 provide electrical connectors 8 (shown in FIG. 3) for connection to a rear side of LRUs 4 to supply power and data to LRUs 4. In operation, LRUs are subject to heat generation. The LRU tray 3 includes a plurality of ventilation openings 7 (shown in FIG. 3) to allow airflow up or down through the LRU trays 3 and thus to the LRUs 4 for cooling. The LRU trays 3 provide the support, electrical connections and fastening elements needed to securely hold the LRUs in the equipment rack 2 during flight.

Figure 3:
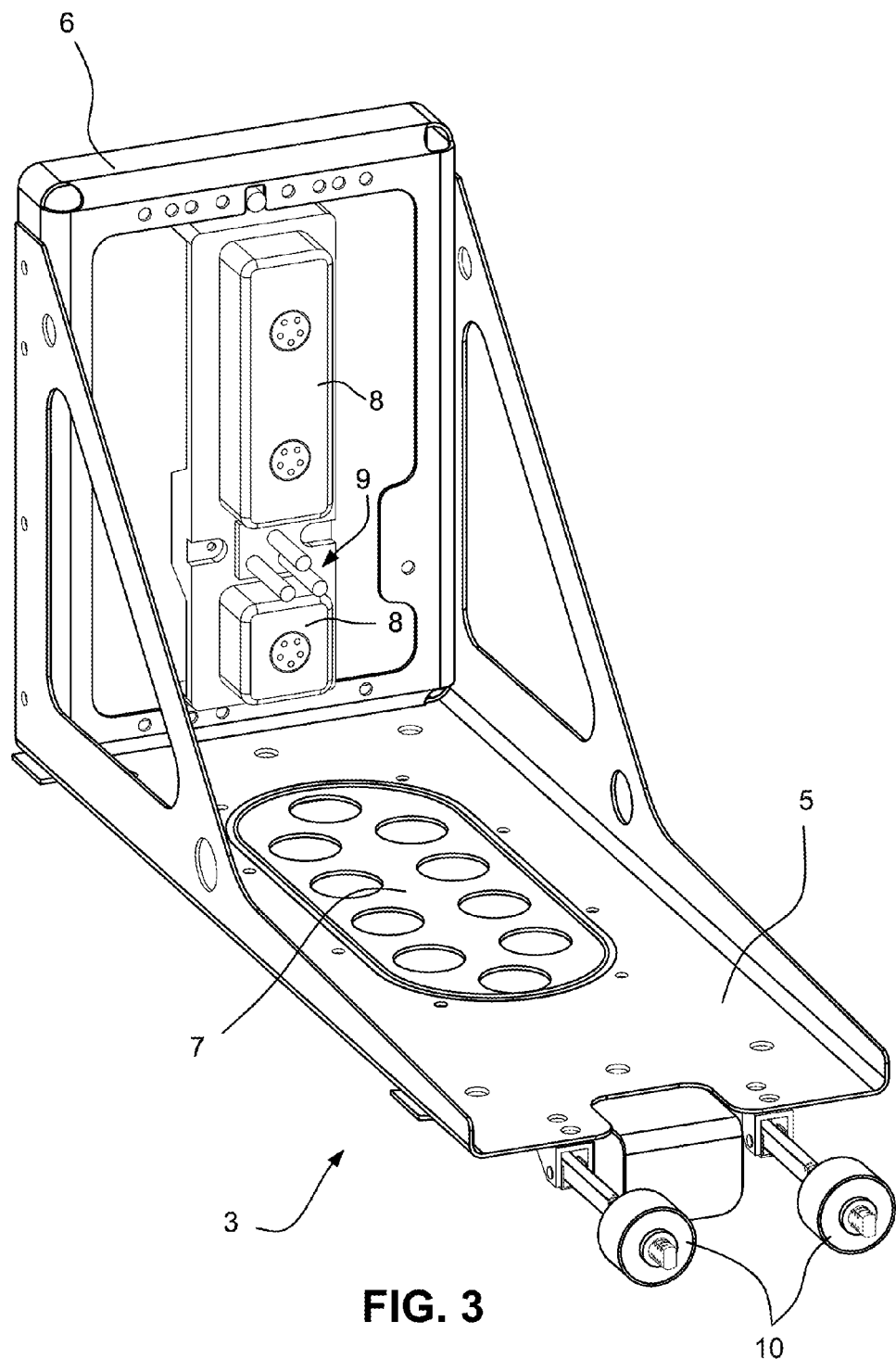
FIG. 3 is a view of an LRU tray and a tray side connector.

FIG. 3 shows a LRU tray 3 that includes a supporting plate 5. The supporting plate 5 includes openings 7 providing airflow to an installed LRU 4. LRU tray 3 further includes a back plate 6. The back plate 6 includes provisions for LRU electrical connectors 8 and projections 9. The projections 9 are a key to ensure that only an appropriate LRU 4 fits into a respective LRU tray 3. LRU tray 3 further includes hold-downs 10 to secure LRU 4 to LRU tray 3. Hold-downs 10 are threaded thumb-screws disposed on a threaded rod. LRU 4 also includes fastening elements 11, such as J-hooks (shown in FIG. 4).

To install a LRU 4 onto LRU tray 3, a user rotates hold-downs 10 on the threaded rod facilitating engagement with fastening elements 11. Engagement with fastening elements 11 by hold-downs 10 secures LRU 4 to LRU tray 3 from movement and from vibration and ensures good electrical connection between the LRU 4 and the electrical connector.

Figure 4:
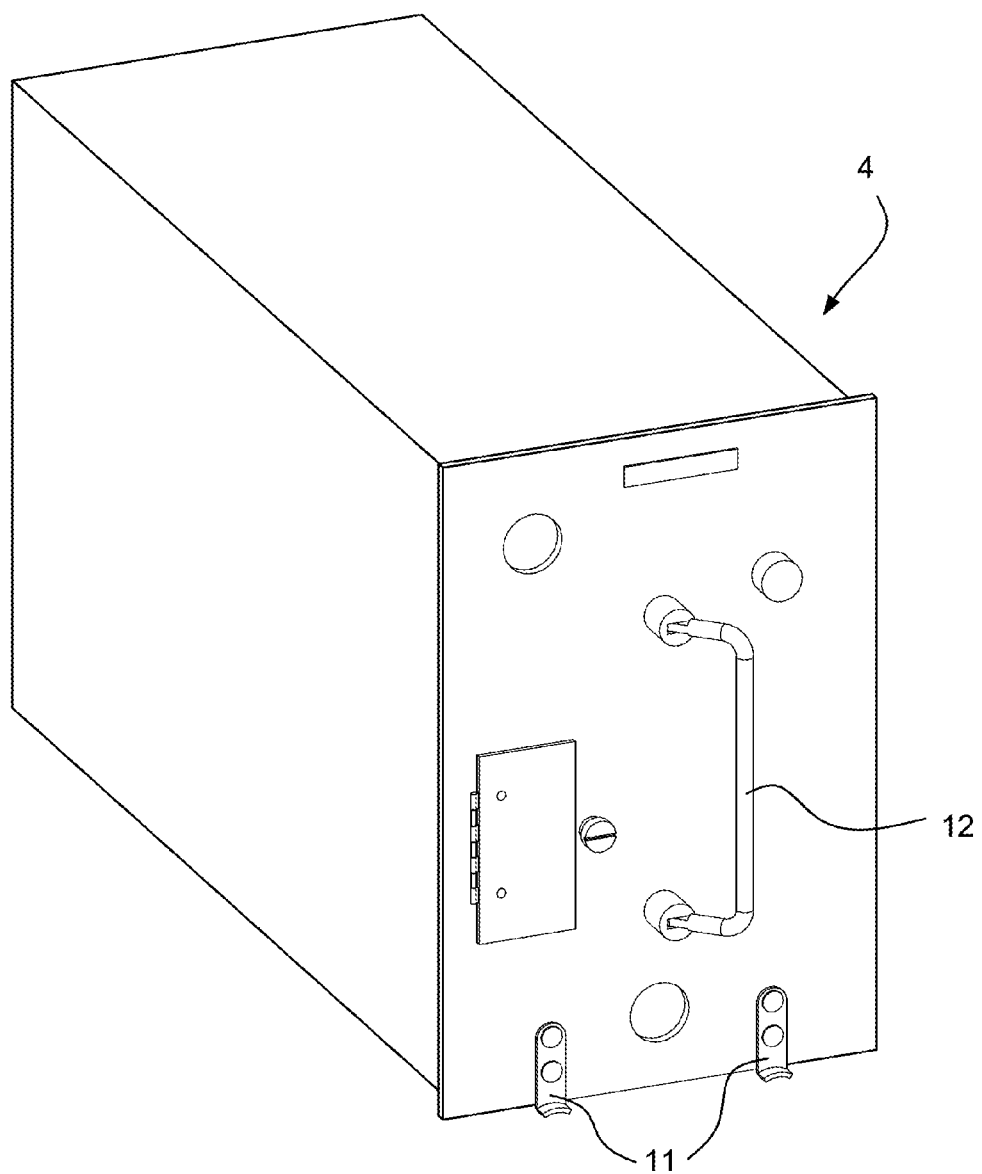
FIG. 4 is a view of an LRU.

FIG. 4 shows a view of an LRU 4. LRU 4 includes fastening elements 11 to engage hold-downs 10. Engagement of fastening elements 11 with hold-downs 10 facilitates securement of LRU 4 to LRU tray 3 and thus to equipment rack 2. LRU 4 also includes a handle 12. Handle 12 allows simple and efficient removal and installation of LRU 4.

Figure 5:
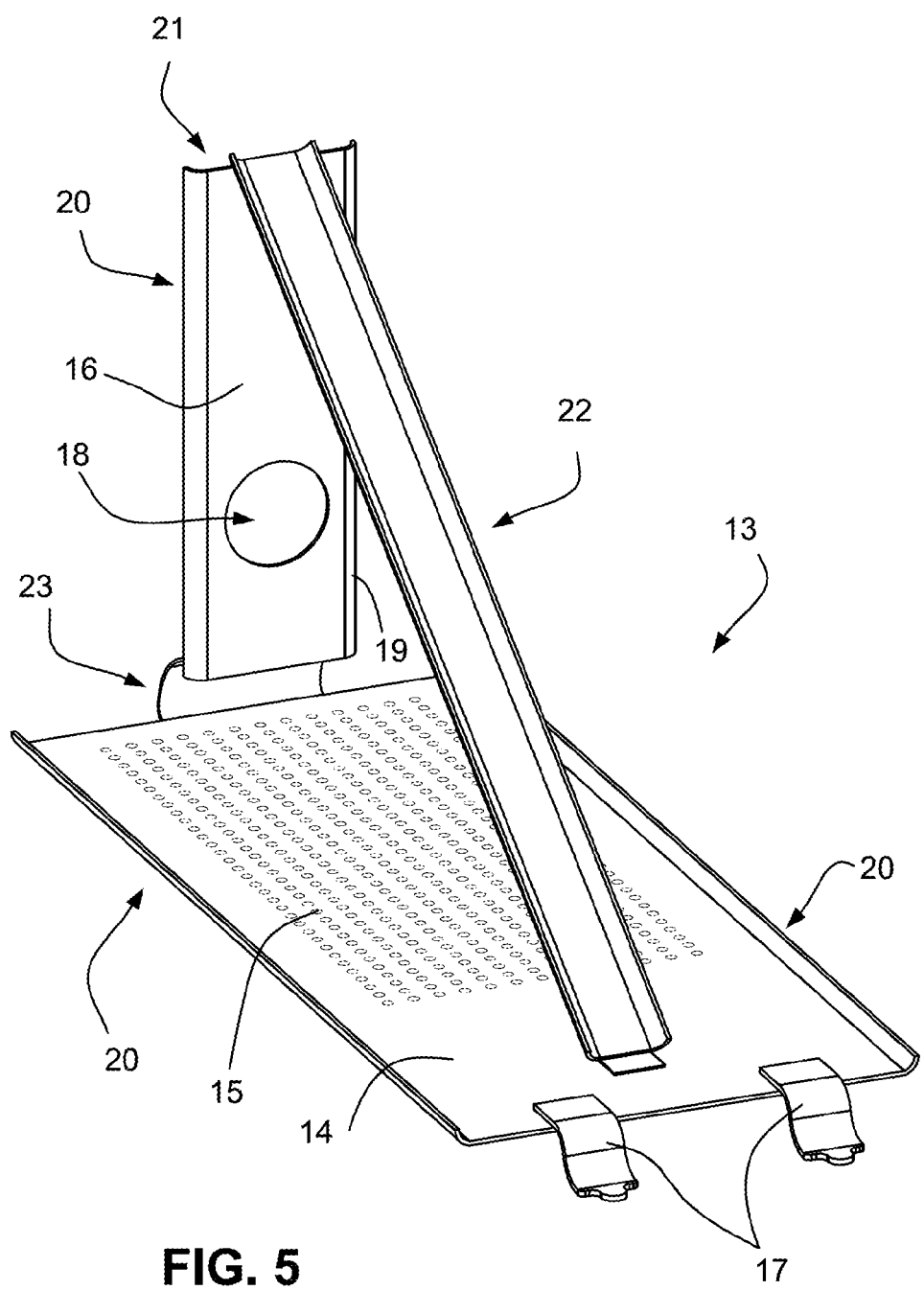
FIG. 5 is a view of a Dummy LRU.

FIG. 5 shows a perspective view of a Dummy LRU (DLRU) 13 for installation on an empty LRU tray 3. DLRU 13 includes a base plate 14, a support member 16, and a reinforcing member 22.

The base plate 14 may include ventilation openings 15 for controlling airflow through the LRU tray 3. The size and shape of the openings 15 and the pattern of the openings allow DLRU 13 to control airflow in manner that mimics an installed LRU 4. The size, shape and pattern of the openings 15 are configured to achieve a pressure drop across the base plate that is substantially similar, such as within twenty percent, to the pressure drop across a LRU 4 from top to bottom of the LRU. The ventilation openings on the base plate may not be needed, such as if there is no concern that the airflow through the equipment rack will be adversely affected by the presence of the DLRU.

When DLRU 13 is installed onto LRU tray 3, air flowing through openings 7 of the LRU tray 3 flows through openings 15 of DLRU 13. By selecting the size, shape and quantity of the openings 15, the DLRU 13 controls the pressure drop to match the pressure drop due to a LRU 4. Thus, the DLRU 13 causes the same airflow through the LRU tray 3 that occurs while a LRU 4 is in the tray.

Because the DLRU 13 matches the airflow resistance of an installed LRU 4 and assuming that each LRU tray 4 has a DLRU 13 or an LRU 4, the airflow through the equipment rack 2 is uniform regardless of the configuration of LRUs 4 and DLRUs 13 in the equipment rack 2. By establishing a procedure that all LRU trays 4 are to be filled with a LRU 4 or a DLRU 13, the airflow can be treated as being uniform through the equipment rack and the LRUs 4 in the equipment rack 2. The airflow will be uniform for all operating configurations of the equipment rack 2. Thus, testing of the airflow through the equipment rack 2 can be confined to a single configuration of the equipment rack 2 in which all LRU trays 3 are filled with an LRU 4 or DLRU 13.

Base plate 14 and support member 16 include ribs 19 and 20 along their side edges to provide additional strength and integrity to the DLRU 13. Support member 16 may include an opening 18 through which projections 9 extend. The projections 9 extend into corresponding slots in the LRU 4. The projections 9 perform a key function to ensure that only a LRU designated to seat in the LRU tray 3 may seat in the tray and connect to the corresponding connectors 8.

Seal element 21 is disposed on support member 16, e.g., a back support, to seal connectors 8 of LRU tray 3 when DLRU 13 is disposed on LRU tray 3. The seal element 21 may include a foam gasket material attached to the support member 16. The foam gasket material may face and engage the connectors 8.

The seal element 21 prevents unwanted intrusion of debris, is simple to install, and may be airtight and watertight. As LRU trays 3 are utilized globally, a method to seal electrical connectors 8 is highly desirable.

DLRU 13 also includes fastening elements 17, such as J-hooks, disposed on a surface of base plate 14. When DLRU 13 is installed onto LRU tray 3, hold-downs 10 are threaded along a threaded rod such that hold-downs 10 engage fastening elements 17. Engagement of hold-downs 10 with fastening elements 17 secures both hold-downs 10 and DLRU 13. Engaging fastening elements 17 with hold-downs 10 provides a rigid assembly between fastening elements 17 and hold-downs 10 which reduces vibrations of hold-downs 10 and thus reduces noise caused by vibration of hold-downs 10. Reducing vibrations of hold-down 10 further reduces wear and tear of hold-downs 10.

DLRU 13 further includes a wedge element 23 that connects the base plate 14 to a lower end of the support member 16. The wedge element 23 engages underneath the electrical connector 8 at the back of the LRU tray 3. The engagement of wedge element 23 to the electrical connector 8 further secures DLRU 13 to LRU tray 3.

DLRU 13 includes a reinforcing member 22 to reinforce and secure DLRU 13 to the electrical connector 8. Reinforcing member 22 is connected to a top portion of support member 16 and to a portion of base plate 14. When seal element 21 is engaged with an electrical connector 8, and when fastening elements 17 engage hold-downs 10, reinforcing member 22 and wedge element 23 bias the seal element 21 against the electrical connector 8. Although described as attached to the support member 16 and base plate 14, other configurations of reinforcing member 22 are contemplated in which the reinforcing member 22 biases or secures seal element 21 to the electrical connector 8.

Figure 6:
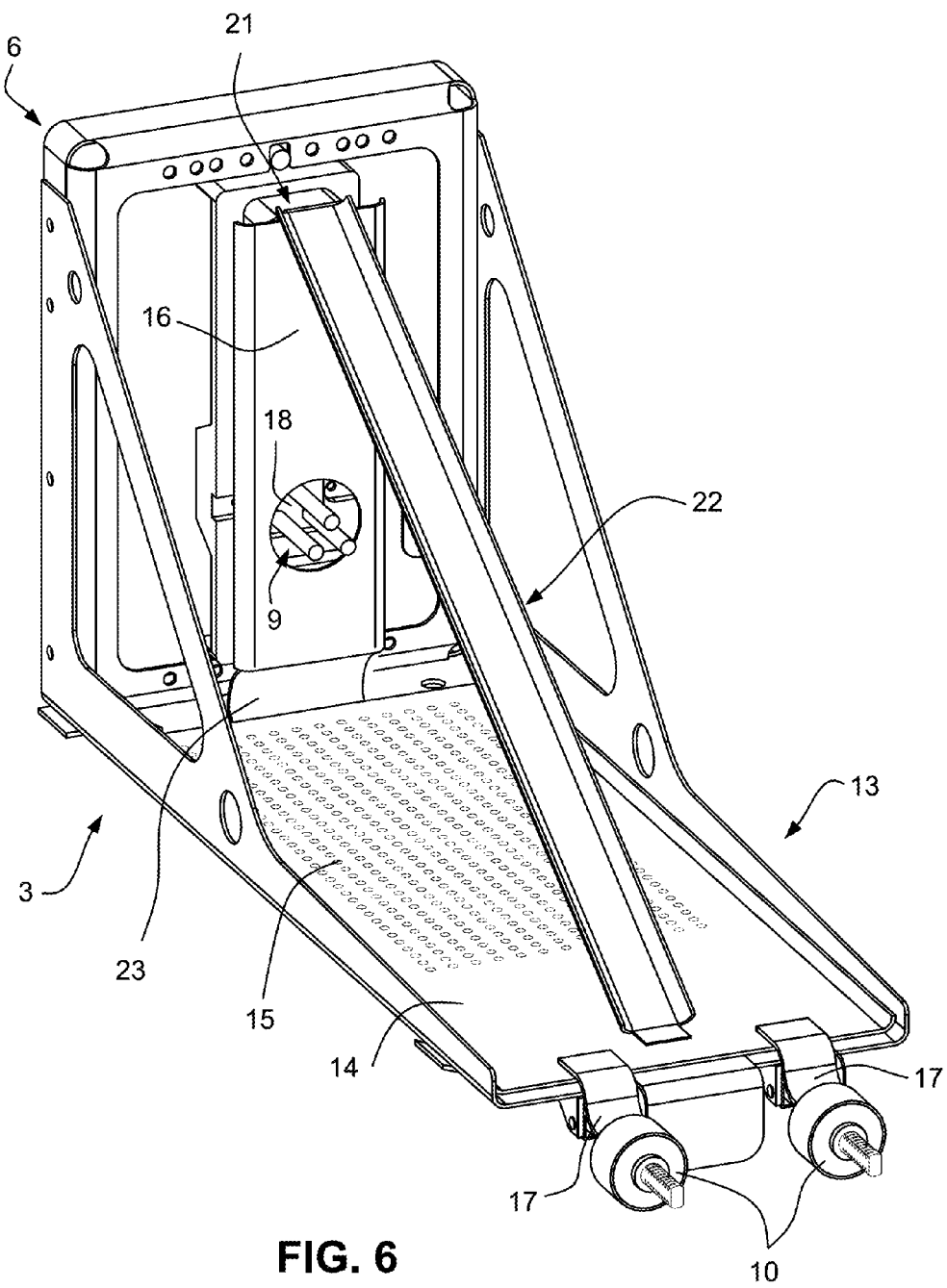
FIG. 6 is a view of a Dummy LRU installed on an LRU tray.

FIG. 6 shows a view of DLRU 13 installed on LRU tray 3. Seal element 21 engages and seals the electrical connector 8. Projections 9 are disposed through opening 18, and hold-downs 10 are threaded onto the threaded rod such that they engage fastening elements 17 and thus secure DLRU 13 to LRU tray 3. Wedge element 23 and reinforcing member 22 bias support member 16 and thus seal element 21 against the electrical connector 8 thus providing a tight seal.

Openings 15 of DLRU 13 are disposed over openings 7 of LRU tray 3. Air flowing through openings 7 are thus limited by openings 15. Limiting airflow through openings 15 mimics an installed LRU 4. Mimicking an installed LRU 4 allows sufficient air to flow to other installed LRUs 4 ensuring sufficient cooling of installed LRUs 4.

Figure 7:
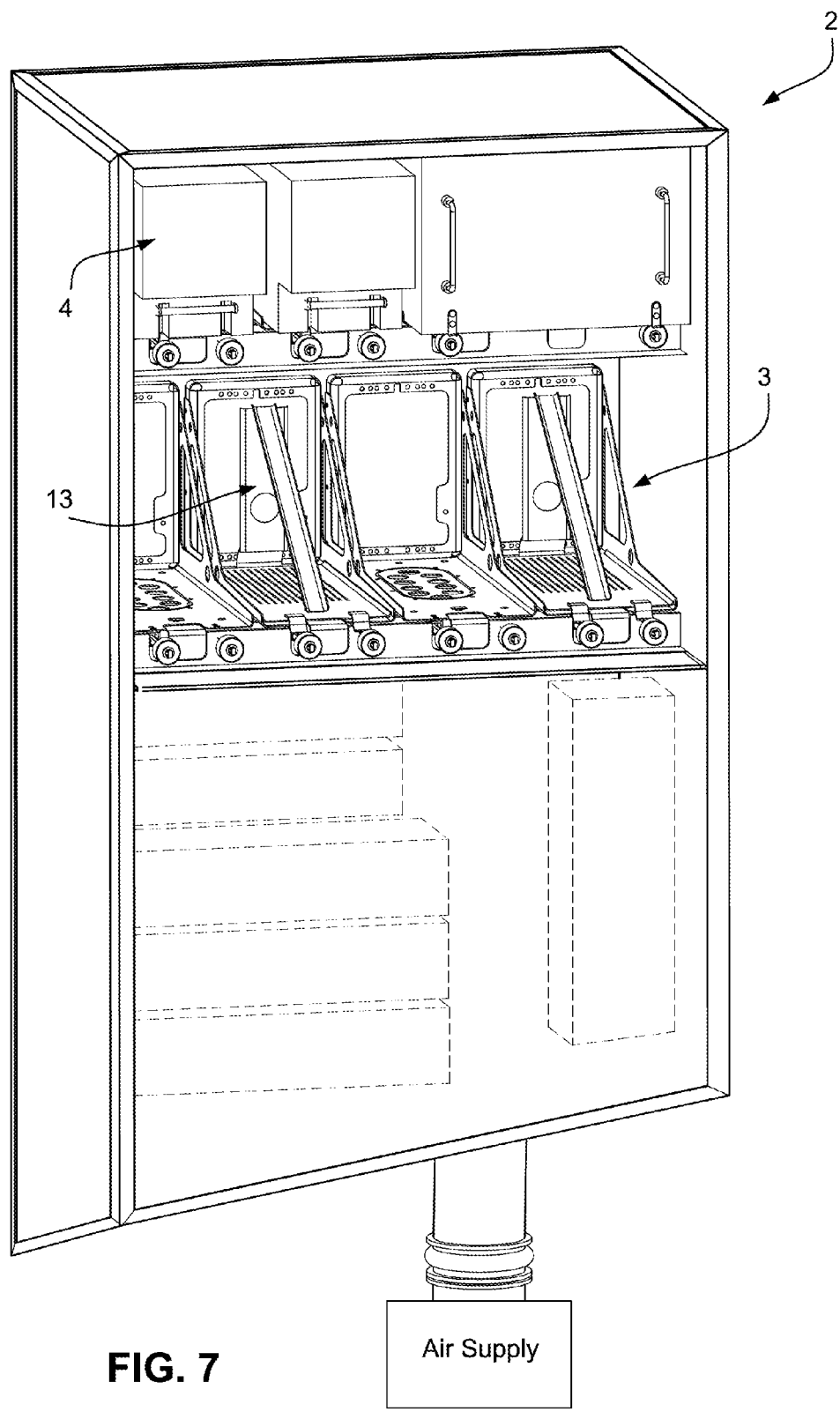
FIG. 7 is a view of a Dummy LRU tray installed on an LRU tray in an equipment rack.

FIG. 7 shows a view equipment rack 2 with empty LRU trays 3 and DLRU 13 installed on some LRU trays 3. DLRU 13 mimics the airflow of the installed LRUs 4. DLRU 13 is shown secured to LRU tray 3 and equipment rack 2 by hold-downs 10 engaged with fastening elements 17. An Air supply, such as a fan, supplies air to the LRU trays 3, installed LRUs 4, and DLRU 13 through the equipment rack 2.

Use of DLRU 13 on an otherwise empty LRU tray 3 provides numerous benefits. DLRU 13 seals the connector 8 corresponding to the LRU tray 3 via the seal element 21 on the support member 16. Seal element 21 prevents intrusion of debris and can be watertight or airtight. Further, openings 15 on the base plate 14 of the DLRU 13 mimic the airflow characteristics of the LRU 4 that the DLRU 13 is replacing, which provides greater airflow control and airflow distribution across LRU tray 3 and equipment rack 2. DLRU 13 further provides securement for the hold-downs 10 on the LRU tray 3 by requiring them for installation. Securing hold-downs 10 to fastening elements 17 reduces wear and tear of hold-downs 10, reduces vibrations, and reduces noise caused by vibrations. Securing the DLRU 13 to the electrical connector 8 via the wedge element 23 helps maintain pressure against the LRU tray 3.

DLRU 13 may be made of a rigid material such as a sheet metal, plastic or a composite material. DLRU 13 may be manufactured as a single piece component or as a multiple piece component. DLRU 13 may be formed in any suitable method including stamping, 3-D printing, extrusion, welding, fastening, or pressing.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A Dummy line replaceable unit (LRU) configured to mount on a line replaceable unit tray in an equipment rack, the Dummy LRU comprising:
 a base plate having an uncovered upper surface and a lower surface configured to face a supporting plate of the line replaceable unit tray, wherein the uncovered upper surface is configured to face an open interior region of the equipment rack;
 a support member oriented orthogonally to the base plate;
 a wedge element configured to be biased against the line replaceable unit tray or a structure of the equipment rack aligned with the line replaceable unit tray, wherein a first edge of the base plate is connected to at least one of the support member and the wedge element, and
 a fastening element at a second edge, opposite to the first edge, of the base plate, wherein the fastening element is configured to engage a hold-down fastener of the line replaceable unit tray.

2. The Dummy LRU of claim 1 further comprising a seal element disposed on the support member, wherein the seal element is configured to seal an electrical connector aligned with the LRU tray.

3. The Dummy LRU of claim 1, wherein the base plate comprises a plurality of openings configured to create a predetermined pressure drop across the base plate while the Dummy LRU is in an equipment rack.

4. The Dummy LRU of claim 1, further comprising a reinforcing member connected to the support member and to the base plate, wherein the reinforcing member includes a rigid beam extending from the support member to the base plate.

5. The Dummy LRU of claim 4 wherein the wedge element and the reinforcing member are configured to bias the seal element against the electrical connector of the line replaceable unit tray.

6. The Dummy LRU of claim 4, wherein the base plate is in a horizontal orientation, the support member is in a vertical orientation, and a lower end of the support member is connected to the wedge and an upper region of the support member is connected to an upper end region of the reinforcing member.

7. The Dummy LRU of claim 1, wherein the base plate, wedge element and the support member are a single piece component formed of sheet metal.

8. A Dummy line replaceable unit (LRU) configured to mount on a line replaceable unit tray in an equipment rack, the Dummy LRU comprising:
 a base plate having an uncovered upper surface and a lower surface configured to face a supporting plate of the line replaceable unit tray, wherein the uncovered upper surface is configured to face an open interior region of the equipment rack;
 a plurality of ventilation openings in the base plate configured to align with ventilation openings in the supporting plate of the line replaceable unit tray;
 a wedge element attached to a first edge of the base plate, wherein the wedge element is configured to be biased against the line replaceable unit tray, and
 a fastening element at a second edge, opposite to the first edge, of the base plate, wherein the fastening element is configured to engage a hold-down fastener of the line replaceable unit tray or an electrical connector associated with the line replaceable unit tray.

9. The Dummy LRU of claim 8 further comprising:
 a support member connected to the first edge region of the base plate or to the wedge element, and
 a seal element disposed on the support member, wherein the seal element is configured to seal an electrical connector aligned with the line replaceable unit tray.

10. The Dummy LRU of claim 8, further comprising a reinforcing member connected to an upper region of the support member and to the base plate, wherein the reinforcing member includes a rigid beam extending from the upper region of the support member to the base plate.

11. The Dummy LRU of claim 8, wherein the base plate and wedge element are a single piece component formed of sheet metal.

12. An assembly of a line replaceable unit (LRU) tray and a Dummy line replaceable unit (DLRU) comprising:
 an LRU tray including:
 a horizontal supporting plate;
 a vertical back plate at a rear of the supporting plate and orthogonal to the supporting plate, wherein the vertical back plate includes an opening through which extends an electrical connector, and
 a hold-down fastener at a front of the supporting plate;
 a Dummy LRU configured to be installed on the LRU tray, the Dummy LRU including:
 a base plate, wherein the base plate includes ventilation openings facing ventilation openings in the of supporting plate of the LRU tray;
 a support member connected to a first edge region of the base plate;
 a seal element disposed on the support member, wherein the seal element is configured to seal the electrical connector, and
 a fastener element at a second edge, opposite to the first edge, of the base plate, wherein the fastener element is configured to engage the hold-down fastener of the LRU tray.

13. The assembly of claim 12 wherein the base plate of the Dummy LRU further comprises a wedge element included in the first edge region, wherein the wedge element is biased against the vertical back plate by an interaction between the fastener element and the hold-down fastener of the LRU tray.

14. The assembly of claim 12, wherein the base plate of the Dummy LRU and back support of the Dummy LRU comprise rib elements disposed on edges thereof configured to provide additional strength and rigidity to the Dummy LRU.

15. The assembly of claim 12, wherein at least the base plate of the Dummy LRU, support member of the Dummy LRU and wedge element are formed as a single piece by stamping.

16. The assembly of claim 12, wherein the wherein at least the base plate of the Dummy LRU, support member of the Dummy LRU and wedge element are formed of sheet metal.

17. The assembly of claim 12, wherein the reinforcing member is connected to a top edge of the support member of the Dummy LRU and to a surface of the base plate of the Dummy LRU.

18. A method of installing a Dummy line replaceable unit (DLRU) on an equipment rack, the method comprising:
- placing a line replaceable unit (LRU) tray on the equipment rack;
- overlaying a base plate of the Dummy LRU over a support plate of the LRU tray;
- sealing an electrical connector adjacent the LRU tray with a seal element on the support member of the Dummy LRU;
- wedging a wedge element of the base plate of the Dummy LRU against the LRU tray or the electrical connector;
- aligning a fastener element of the base plate with a hold-down fastener of the LRU tray, wherein the fastener element is at an edge of the base plate opposite to the wedge element;
- engaging the hold-down fastener of the LRU tray with the fastener element of the base plate, such that the hold-down fastener applies a bias force to the base plate, and
- biasing the wedge element against the LRU tray by the bias force.

19. The method of claim 18 wherein the overlaying of the base plate includes aligning ventilation openings in the base plate align with ventilation openings in the support plate.

20. The method of claim 18, further comprising biasing the seal element against the electrical connector by a reinforcing beam fixed to an upper portion of the seal element and fixed to the base plate.

21. A method of installing line replaceable units (LRUs) on an equipment rack, the method comprising:
- for each line replaceable unit (LRU) trays in the equipment rack, determining if the LRU tray is supporting a LRU or whether the LRU tray is unused, and
- for each of the unused LRU trays, installing a Dummy LRU on the LRU tray,
- wherein all of the LRU trays in the equipment rack have one of the Dummy LRUs or the LRUs.

22. The method of claim 21 further comprising ventilating the LRUs in the equipment rack with an airflow passing through the equipment rack, wherein the airflow passes through ventilation openings in the LRU trays and ventilation openings in a base plate of the Dummy LRUs, wherein the ventilation openings in the base plate of each of the Dummy LRUs is aligned with the ventilation openings in a respective one of the LRU trays.

* * * * *